United States Patent
Wu

(10) Patent No.: US 9,680,425 B2
(45) Date of Patent: Jun. 13, 2017

(54) DRIVER CIRCUIT AND ASSOCIATED POWER AMPLIFIER ASSEMBLY, RADIO BASE STATION AND METHOD

(71) Applicant: TELEFONAKTIEBOLAGET L M ERICSSON (PUBL), Stockholm (SE)

(72) Inventor: Zhanyu Wu, Beijing (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/914,067

(22) PCT Filed: Aug. 29, 2013

(86) PCT No.: PCT/CN2013/082568
§ 371 (c)(1),
(2) Date: Feb. 24, 2016

(87) PCT Pub. No.: WO2015/027433
PCT Pub. Date: Mar. 5, 2015

(65) Prior Publication Data
US 2016/0211812 A1    Jul. 21, 2016

(51) Int. Cl.
*H03F 3/04* (2006.01)
*H03F 1/56* (2006.01)
(Continued)

(52) U.S. Cl.
CPC .............. *H03F 1/56* (2013.01); *H03F 1/0205* (2013.01); *H03F 3/005* (2013.01); *H03F 3/193* (2013.01);
(Continued)

(58) Field of Classification Search
CPC ........................................................ H03F 3/04
(Continued)

(56) References Cited

U.S. PATENT DOCUMENTS 5,548,246 A * 8/1996 Yamamoto ............ H03F 1/0277
330/277
6,236,274 B1 * 5/2001 Liu ......................... H03F 3/217
330/302
(Continued)

FOREIGN PATENT DOCUMENTS

CN    101656509 A    2/2010
CN    102790595 A    11/2012
(Continued)

*Primary Examiner* — Patricia T Nguyen

(57) ABSTRACT

A driver circuit for a power amplifier of a radio base station. The driver circuit comprises a radio frequency input, an output for connection to a power amplifier, a combiner connected to the radio frequency input and a first bias leg. The first bias leg comprises a bias source input, a first capacitor leg and a second capacitor, wherein the first capacitor leg is connected between the combiner and ground, and the second capacitor is connected between the combiner and ground. The first capacitor leg comprises a first switch and a first capacitor, the first switch being provided between the combiner and the first capacitor such that, in a first state, the first capacitor is connected to the combiner and, in a second state, the first capacitor is disconnected from the combiner. A corresponding power amplifier assembly, radio base station and method are also presented.

12 Claims, 2 Drawing Sheets

(51) Int. Cl.
- H03F 3/193 (2006.01)
- H03F 3/24 (2006.01)
- H03F 3/72 (2006.01)
- H03F 1/02 (2006.01)
- H03F 3/00 (2006.01)
- H03F 3/21 (2006.01)
- H04W 88/08 (2009.01)

(52) U.S. Cl.
CPC ............... *H03F 3/21* (2013.01); *H03F 3/245* (2013.01); *H03F 3/72* (2013.01); *H04W 88/08* (2013.01); *H03F 2200/267* (2013.01); *H03F 2200/27* (2013.01); *H03F 2200/451* (2013.01)

(58) Field of Classification Search
USPC .................................. 330/296, 302, 127
See application file for complete search history.

(56) References Cited

U.S. PATENT DOCUMENTS

| | | | |
|---|---|---|---|
| 6,346,854 B1 * | 2/2002 | Heithoff | H03F 1/305 330/149 |
| 6,759,836 B1 | 7/2004 | Black, Jr. | |
| 7,741,912 B1 | 6/2010 | Nadimpalli | |
| 7,816,951 B1 * | 10/2010 | Lee | G11C 27/024 327/94 |
| 2002/0067209 A1 | 6/2002 | Luo et al. | |
| 2006/0178119 A1 | 8/2006 | Jarvinen | |
| 2007/0120597 A1 * | 5/2007 | Shimizu | H03F 1/305 330/51 |
| 2009/0137218 A1 | 5/2009 | Honda et al. | |
| 2012/0154035 A1 | 6/2012 | Hongo et al. | |
| 2013/0214862 A1 | 8/2013 | Presti et al. | |
| 2014/0184334 A1 * | 7/2014 | Nobbe | H03F 1/0227 330/291 |
| 2014/0307910 A1 * | 10/2014 | Howlett | H03G 3/348 381/369 |

FOREIGN PATENT DOCUMENTS

| | | |
|---|---|---|
| EP | 0987817 A1 | 3/2000 |
| GB | 2335116 A | 9/1999 |
| JP | 2009044281 A | 2/2009 |
| KR | 1020090036655 A | 4/2009 |

\* cited by examiner

DRIVER CIRCUIT AND ASSOCIATED POWER AMPLIFIER ASSEMBLY, RADIO BASE STATION AND METHOD

This application is a 371 of International Application No. PCT/CN2013/082568, filed Aug. 29, 2013, the disclosure of which is fully incorporated herein by reference.

TECHNICAL FIELD

The invention relates to a driver circuit and associated power amplifier assembly, radio base station and method.

BACKGROUND

Power amplifiers are used e.g. in radio base stations in mobile communication networks. The input signal for the power amplifiers is often biased to achieve a desired operating voltage for the input signal. This biasing can e.g. be performed in a driver circuit for a power amplifier. The source for the biasing can be provided by a DC (Direct Current) source.

JP2009044281 presents a FET amplifier circuit in which an FET amplifier element has improved switching speed. The FET amplifier circuit is provided with: a bias voltage sudden step-up circuit and a bias voltage sudden drop circuit. However, the presented amplifier circuit, while providing a bias, is unable to decouple the baseband from the biasing.

Another solution is to provide one or more capacitors as part of the biasing circuit to remove any RF components on the DC source and/or to provide a voltage stiff DC source for the biasing. A large capacitor is desired for a stable voltage level, but a small capacitor is desired to be able to switch off (and on) the biasing quickly, e.g. for Time-division Duplex operation such as for LTE (Long Term Evolution).

The balance between a large and a small capacitor is difficult to optimise and it would be ideal if the benefits of both small and large capacitors can somehow be achieved.

SUMMARY

It is an object to provide a way to provide bias to a power amplifier which allows for both voltage stiff operation and fast connection and disconnection of the bias.

According to a first aspect, it is provided a driver circuit for a power amplifier of a radio base station. The driver circuit comprises: a radio frequency input; an output for connection to a power amplifier; a combiner connected to the radio frequency input and a first bias leg, the combiner being arranged to combine signals from the radio frequency input and the first bias leg to thereby provide a combined signal to the output. The first bias leg comprises a bias source input, a first capacitor leg and a second capacitor, wherein first capacitor leg is connected between the combiner and ground, and the second capacitor is connected between the combiner and ground. The first capacitor leg comprises a first switch and a first capacitor, the first switch being provided between the combiner and the first capacitor such that, in a first state, the first capacitor is connected to the combiner and, in a second state, the first capacitor is disconnected from the combiner. In this way, the speed of a small capacitor is achieved with the capacity of a large capacitor, improving performance of the connected power amplifier.

The driver circuit may further comprise a controller connected to the first switch, wherein the controller is arranged to set the first switch in the first state when a connected power amplifier is in a transmission time slot and to set the first switch in the second state when a connected power amplifier is in a reception time slot.

The capacitance of the first capacitor may be greater than the capacitance of the second capacitor.

The driver circuit may be further comprise a second bias leg connected to the combiner, the second bias leg comprising a second capacitor leg and a fourth capacitor, wherein second capacitor leg is connected between the combiner and ground, and the fourth second capacitor is connected between the combiner and ground. In such a case, the second capacitor leg comprises a second switch and a third capacitor, the second switch being provided between the combiner and the third capacitor such that, in the first state, the third capacitor is connected to the combiner and, in the second state, the third capacitor is disconnected from the combiner.

The capacitance of the third capacitor may be greater than the capacitance of the fourth capacitor.

The driver circuit may further comprise a third switch provided between the bias source input and ground, the third switch being able to be controlled such that, in the first state, the bias source input is connected to the combiner, and in the second state, the bias source input is connected to ground.

The driver circuit may, further comprise a resistor between the bias source input and the third switch.

According to a second aspect, it is provided a power amplifier assembly comprising a driver circuit according to the first aspect and a power amplifier connected to the output of the driver circuit.

According to a third aspect, it is provided a radio base station comprising at least one power amplifier assembly according to the second aspect.

According to a fourth aspect, it is provided a method performed in a radio base station comprising a power amplifier assembly comprising a driver circuit and a power amplifier, the driver circuit comprising a radio frequency input; an output connected to the power amplifier; and a combiner connected to the radio frequency input and a first bias leg, the combiner being arranged to combine signals from the radio frequency input and the first bias leg to thereby provide a combined signal to the output. The first bias leg comprises a bias source input, a first capacitor leg and a second capacitor, wherein first capacitor leg is connected between the combiner and ground, and the second capacitor is connected between the combiner and ground; wherein the first capacitor leg comprises a first switch and a first capacitor, the first switch being provided between the combiner and the first capacitor. The method comprises the steps of: determining whether the first switch should be set in a first state or a second state; when in a first state, connecting the first capacitor to the combiner and, when in a second state, disconnecting the first capacitor from the combiner.

The step of determining may comprise determining to set the first switch in the first state when the power amplifier is in a transmission time slot and determining to set the first switch in the second state when the power amplifier is in a reception time slot.

The method may further comprise the steps of: when in a first state, disconnecting a third switch provided between the bias source input and ground, such that the bias source input is connected to the combiner, and in the second state, the bias source input is connected to ground.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
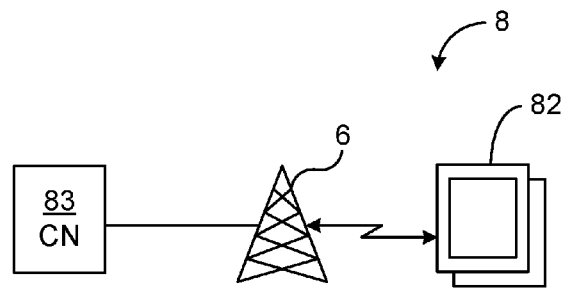
FIG. 1 is a schematic diagram illustrating an environment where embodiments presented herein can be applied.

FIG. 1 is a schematic diagram illustrating an environment where embodiments presented herein can be applied. A mobile communications network 8 comprises a core network 83 and a radio access network comprising one or more radio base stations 6. The radio base stations 6 are here in the form of evolved Node Bs also known as eNBs but could also be in the form of Node Bs (NodeBs/NBs) and/or BTSs (Base Transceiver Stations) and/or BSSs (Base Station Subsystems), etc. The radio base stations 6 provide radio connectivity to a plurality of wireless devices 82. The term wireless device is also known as user equipment (UE), mobile terminal, user terminal, user agent, etc.

Each one of the radio base stations 6 provides radio coverage in one or more respective radio cells. Uplink (UL) communication, from the wireless device 82 to the radio base station 6, and downlink (DL) communication, from the radio base station 6 to the wireless device 82 occur over a wireless radio interface. The radio conditions of the wireless radio interface vary over time and also depend on the position of the wireless device 82, due to effects such as interference, fading, multipath propagation, etc.

The core network 83 provides access to central functions in the mobile communication network 8 and connectivity to other communication networks.

The mobile communications network 8 may e.g. comply with any one or a combination of LTE (Long Term Evolution), UMTS utilising W-CDMA (Wideband Code Division Multiplex), CDMA2000 (Code Division Multiple Access 2000), GSM (Global System for Mobile Communication) or any other current or future wireless network, as long as the principles described hereinafter are applicable. Nevertheless, LTE will be used below to fully illustrate a context in which embodiments presented herein can be applied.

Figure 2:
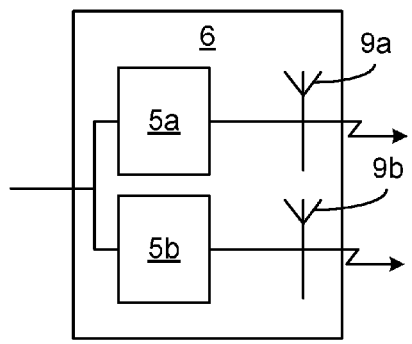
FIG. 2 is a schematic diagram illustrating some components of the radio base station of FIG. 1.

FIG. 2 is a schematic diagram illustrating some components of the radio base stations 6 of FIG. 1, here illustrated as a single radio base station 6. Looking from a transmission perspective, the radio base station 6 receives a signal input e.g. from the core network, and transmits radio signals using one or more antennas 9a-b, previously amplified using a respective power amplifier assembly 5a-b. When there is more than one antenna, the signal input can be split and provided to each one of the power amplifier assemblies 5a-b, e.g. using weighting matrices in the digital domain. The radio base station 6 also comprises one or more digital to analogue (D/A) converters (not shown).

Figure 3:
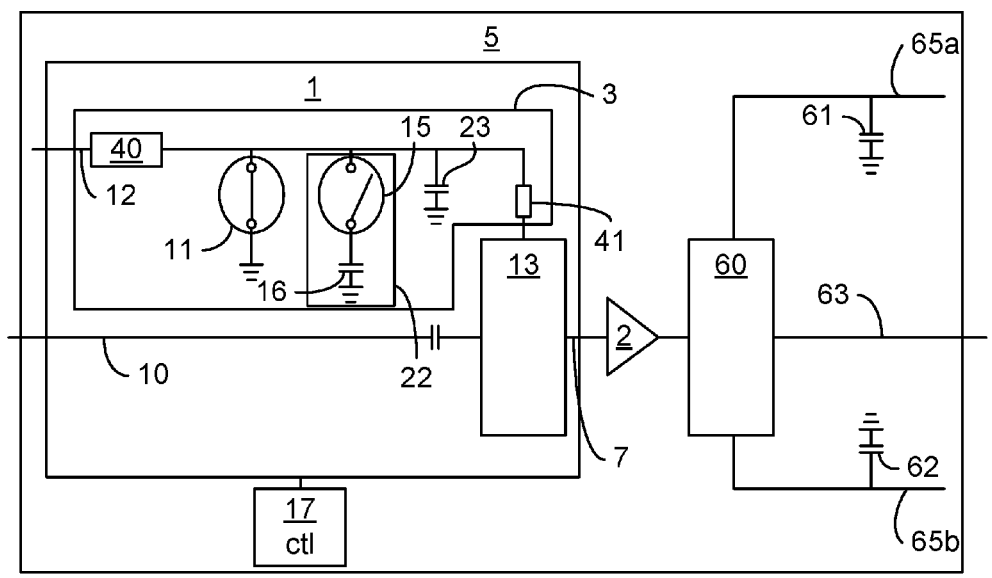
FIG. 3 is a schematic diagram illustrating a power amplifier assembly of FIG. 2 according to one embodiment.

FIG. 3 is a schematic diagram illustrating a power amplifier assembly 5 of FIG. 2 according to one embodiment, here illustrated by a single power amplifier assembly 5. The power amplifier comprises a power amplifier 2, a driver circuit 1 on the input side and drain circuitry on the output side. On the output side, there is an output combiner 60 connected to drain sources 65a-b and providing an RF output 63 of the power amplifier assembly 5. The drain sources 65a-b are DC sources connected to the combiner 60 via respective spurs of RF removing capacitors 61, 62.

The driver circuit 1 has a radio frequency (RF) input 10, which is connected to a combiner 13. Also connected to the combiner 13 is a bias leg 3 to bias the RF signal provided on the RF input 10. In this way, the operating voltage provided on an output 7 of the driver circuit 1 is at an appropriate input level for the power amplifier 2. The driver circuit 1 is controlled by a controller 17 which can be external to the diver circuit 1 or included within (not shown) the driver circuit 1. Optionally, the controller 17 can be shared between several power amplifier assemblies.

The bias leg 3 comprises a bias source input 12 for connection to a DC source, a first capacitor leg 22 and a second capacitor 23, wherein first capacitor leg 22 is connected between the combiner 13 (optionally via a first resistor 41) and ground, and the second capacitor 23 is connected between the combiner 13 (optionally via the first resistor 41) and ground. The first capacitor leg 22 comprises a first switch 15 and a first capacitor 16.

The first switch 15 is any suitable switch which is controllable between a conducting state and a blocking state. For example, the first switch can be a transistor, such as a MOSFET (metal-oxide-semiconductor field-effect transistor). When present, the first resistor 41 reduces any current from the combiner 13 to ground through the bias leg 3.

The first switch 15 is provided between the combiner 13 and the first capacitor 16 such that, in a first state, the first capacitor 16 is connected to the combiner 13 and, in a second state, the first capacitor 16 is disconnected from the combiner 13. In this way, when the power amplifier is active in the first (connected) state, the capacitor 16 is connected to provide a voltage stiff connection to the combiner 13. The driver circuit 1 can thus provide a current greater than what the bias source input 12 is capable of by itself. The controller 17 controls the first switch 15 and can set the first switch 15 in the first (connected) state when a connected power amplifier 2 is in a transmission time slot and set the first switch 15 in the second (disconnected) state when a connected power amplifier 2 is in a reception time slot. The transmission time slot is when the power amplifier 2 is active and when the biasing is needed, but in the receiving time slot, the biasing can be disconnected to save power.

When in the second (disconnected) state the first capacitor 16 remains charged. This implies that when the first switch 15 is again connected, the first capacitor 16 does not need to be charged and the bias leg 3 is operational much more quickly than in the prior art, where the equivalent of the first capacitor first needs to be charged. Moreover, since the first capacitor 16 does not need to be (re)charged each time when going from the second (disconnected) state to the first (connected) state, faster switching can occur between states. Also the first capacitor 16 can be provided with significantly greater capacitance than what is possible in the prior art. The increased capacitance improves the performance of the power amplifier assembly 5 and has been found, in particular, to reduce intermodulation distortion (IMD) and improve visual bandwidth (VBW).

In one embodiment, the capacitance of the first capacitor 16 is greater than the capacitance of the second capacitor 23. Due to the use of the first switch 15, the first capacitor 16 can be significantly larger than the second capacitor 23, e.g. of a factor thousand or more.

Optionally, the driver circuit 1 also comprises a shortcut switch 11 provided between the bias source input 12 and ground. The shortcut switch 11 is any suitable switch which is controllable between a conducting state and a blocking state. For example, the first switch can be a transistor, such as a MOSFET (metal-oxide-semiconductor field-effect transistor).

The shortcut switch 11 is controllable such that, in the first state, the bias source input 12 is connected to the combiner 13 (i.e. the shortcut switch is in a blocking state), and in the second state, the bias source input 12 is connected to ground (i.e. the shortcut switch is in a conducting state). Optionally, a second resistor 40 is provided between the bias source input 12 and the shortcut switch 11, whereby any current through the shortcut switch 11 is limited.

Optionally, the shortcut switch 11 and the first switch 15 are provided with opposite doping, such that the shortcut switch 11 is an n-type FET and the first switch is a p-type FET, or vice versa. In this way, a single control signal from the controller 17 can control both the first switch 15 and shortcut switch 11 as these are then set in opposite states (conducting/blocking).

Figure 4:
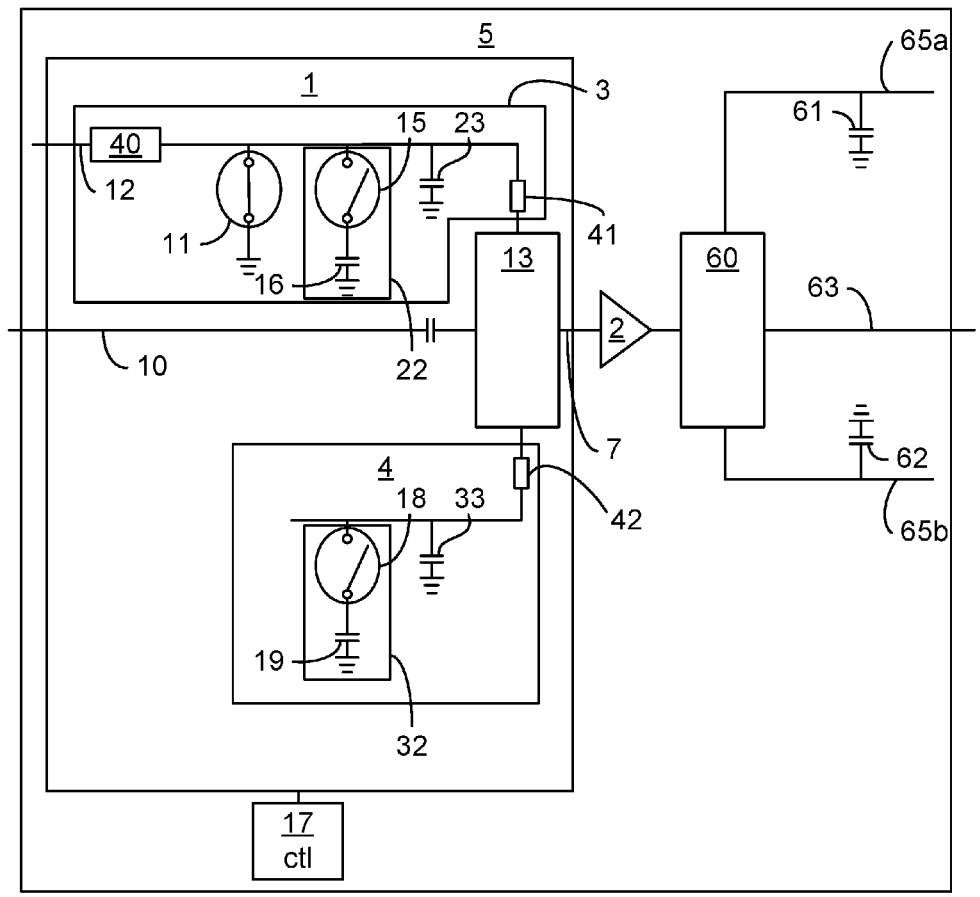
FIG. 4 is a schematic diagram illustrating a power amplifier assembly of FIG. 2 according to one embodiment.

FIG. 4 is a schematic diagram illustrating a power amplifier assembly 5 of FIG. 2 according to one embodiment. The power amplifier assembly 5 of FIG. 4 comprises all the components of the power amplifier assembly 5 of FIG. 3, and only additional or modified components are described here.

In this embodiment, the driver circuit 1 also comprises a second bias leg 4 connected to the combiner 13. The second bias leg 4 comprising a second capacitor leg 32 and a fourth capacitor 33, wherein second capacitor leg 32 is connected between the combiner 13 (optionally via a third resistor 42) and ground, and the fourth second capacitor 33 is connected between the combiner 13 (optionally via the third resistor 42) and ground. The second capacitor leg 32 comprises a second switch 18 and a third capacitor 19. The second switch 18 is any suitable switch which is controllable between a conducting state and a blocking state. For example, the first switch can be a transistor, such as a MOSFET (metal-oxide-semiconductor field-effect transistor). The second switch 18 is provided with the same doping as the first switch 15. In this way, a single control signal could control both the first switch 15 and the second switch 18 as these are controlled synchronously.

The second switch 18 is provided between the combiner 13 (optionally via the third resistor 42) and the third capacitor 19 such that, in the first state, the third capacitor 19 is connected to the combiner 13 and, in the second state, the third capacitor 19 is disconnected from the combiner 13.

In one embodiment, the capacitance of the third capacitor 19 is greater than the capacitance of the fourth capacitor 33. Due to the use of the second switch 18, the third capacitor 19 can be significantly larger than the fourth capacitor 33, e.g. of a factor thousand or more.

The embodiment of FIG. 4 is an embodiment of a dual gate supply configuration, where both the first capacitor 16 and the third capacitor 19 can be dimensioned to be large to achieve the benefits described above with reference to the embodiment shown in FIG. 3.

Figure 5:
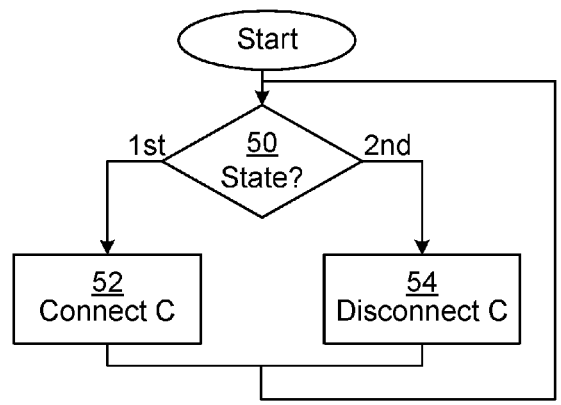
FIG. 5 is a flow chart illustrating a method for biasing a power amplifier e.g. of FIGS. 3 and 4.

FIG. 5 is a flow chart illustrating a method for biasing a power amplifier e.g. of FIGS. 3 and 4. The method is performed in the radio base station 6 of FIG. 1, and more specifically, in a power amplifier assembly of FIG. 3 or 4. The method is executed for a particular power amplifier of the radio base station and can be executed independently, in parallel, for a plurality of power amplifiers.

In a conditional state step 50, it is determined whether the first switch (and second switch if available such as shown in FIG. 4) should be set in a first state or a second state. If the switch(es) are to be set in the first state, the method continues to a connect C step 52. Otherwise, the method continues to a disconnect C step 54. For example, in a transmission time slot, the first (and third capacitor) should be connected, whereby the first switch (and second switch) should be set in the first (connected) state. Conversely, in a receiving time slot, the first (and third capacitor) should be disconnected, whereby the first switch (and second switch) should be set in the second (disconnected) state.

In the connect C step 52, the first capacitor 16 is connected to the combiner 13 by setting the first switch 15 in a conducting state. Moreover, if present, the second switch 18 is set in a conducting state to connect also the third capacitor 19 to the combiner. Optionally, the shortcut switch 11 is set in a blocking state, to thereby ensure the bias source is not shortcut to ground.

In the disconnect C step 54, the first capacitor 16 is disconnected from the combiner 13 by setting the first switch 15 in a blocking state. Moreover, if present, the second switch 18 is set in a blocking state to disconnect also the third capacitor 19 from the combiner. Optionally, the shortcut switch 11 is set in a conducting state, to thereby shortcut the bias source to ground, to effectively disconnect the bias source from the combiner.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A driver circuit for a power amplifier of a radio base station, comprising:
   a radio frequency input;
   an output for connection to a power amplifier; and
   a combiner connected to the radio frequency input and a first bias leg, the combiner being arranged to combine signals from the radio frequency input and the first bias leg to thereby provide a combined signal to the output;
   the first bias leg comprising a bias source input, a first capacitor leg and a second capacitor, wherein first capacitor leg is connected between the combiner and ground, and the second capacitor is connected between the combiner and ground;
   wherein the first capacitor leg comprises a first switch and a first capacitor, the first switch being provided between the combiner and the first capacitor such that, in a first state, the first capacitor is connected to the combiner and, in a second state, the first capacitor is disconnected from the combiner.

2. The driver circuit according to claim 1, further comprising a controller connected to the first switch, wherein the controller is arranged to set the first switch in the first state when a connected power amplifier is in a transmission time slot and to set the first switch in the second state when a connected power amplifier is in a reception time slot.

3. The driver circuit according to claim 1, wherein the capacitance of the first capacitor is greater than the capacitance of the second capacitor.

4. The driver circuit according to claim 1, further comprising a second bias leg connected to the combiner, the second bias leg comprising a second capacitor leg and a fourth capacitor, wherein second capacitor leg is connected between the combiner and ground, and the fourth second capacitor is connected between the combiner and ground;
wherein the second capacitor leg comprises a second switch and a third capacitor, the second switch being provided between the combiner and the third capacitor such that, in the first state, the third capacitor is connected to the combiner and, in the second state, the third capacitor is disconnected from the combiner.

5. The driver circuit according to claim 4, wherein the capacitance of the third capacitor is greater than the capacitance of the fourth capacitor.

6. The driver circuit according to claim 1, further comprising a third switch provided between the bias source input and ground, the third switch being able to be controlled such that, in the first state, the bias source input is connected to the combiner, and in the second state, the bias source input is connected to ground.

7. The driver circuit according to claim 6, further comprising a resistor between the bias source input and the third switch.

8. A power amplifier assembly comprising a driver circuit according to claim 1 and a power amplifier connected to the output of the driver circuit.

9. A radio base station comprising at least one power amplifier assembly according to claim 8.

10. A method performed in a radio base station comprising a power amplifier assembly comprising a driver circuit and a power amplifier, the driver circuit comprising a radio frequency input; an output connected to the power amplifier; and a combiner connected to the radio frequency input and a first bias leg, the combiner being arranged to combine signals from the radio frequency input and the first bias leg to thereby provide a combined signal to the output; the first bias leg comprising a bias source input, a first capacitor leg and a second capacitor, wherein first capacitor leg is connected between the combiner and ground, and the second capacitor is connected between the combiner and ground; wherein the first capacitor leg comprises a first switch and a first capacitor, the first switch being provided between the combiner and the first capacitor, the method comprising the steps of:
determining whether the first switch should be set in a first state or a second state;
when in a first state, connecting the first capacitor to the combiner and,
when in a second state, disconnecting the first capacitor from the combiner.

11. The method according to claim 10, wherein the step of determining comprises determining to set the first switch in the first state when the power amplifier is in a transmission time slot and determining to set the first switch in the second state when the power amplifier is in a reception time slot.

12. The method according to claim 10, further comprising the steps of:
when in a first state, disconnecting a third switch provided between the bias source input and ground, such that the bias source input is connected to the combiner, and in the second state, the bias source input is connected to ground.

* * * * *